United States Patent [19]

Lewis, Jr.

[11] 4,395,729

[45] Jul. 26, 1983

[54] DIGITAL VIDEO SIGNAL PROCESSING FILTERS WITH SIGNAL-TO-NOISE ENHANCEMENT

[75] Inventor: Henry G. Lewis, Jr., Hamilton Square, N.J.

[73] Assignee: RCA Corporation, New York, N.Y.

[21] Appl. No.: 298,255

[22] Filed: Aug. 31, 1981

[51] Int. Cl.³ .................. H04N 9/46; H04N 5/21
[52] U.S. Cl. ............................ 358/21 R; 358/36; 358/19
[58] Field of Search ................. 358/21 R, 36, 19, 23, 358/31, 17, 40, 160, 167; 375/26, 34, 94, 96, 99, 103; 364/724, 515; 343/5 VQ, 5 DP

[56] References Cited

U.S. PATENT DOCUMENTS

| | | | |
|---|---|---|---|
| 3,947,768 | 3/1976 | Desblache | 375/96 |
| 4,040,052 | 8/1977 | Stanislaw | 343/5 VQ |
| 4,044,241 | 8/1977 | Hatley | 375/103 |
| 4,052,605 | 10/1977 | Eggermont | 364/724 |
| 4,242,705 | 12/1980 | Ebihara | 358/36 |
| 4,314,277 | 2/1982 | Pritchard | 358/167 |
| 4,339,803 | 7/1982 | Michael | 358/167 |
| 4,344,089 | 8/1982 | Utsunomiya | 358/167 |

OTHER PUBLICATIONS

Text "Theory and Application of Digital Signal Processing", by Rabiner and Gold, (Prentice-Hall, 1975), p. 550.

Primary Examiner—Michael A. Masinick
Attorney, Agent, or Firm—E. M. Whitacre; P. J. Rasmussen; E. P. Herrmann

[57] ABSTRACT

A digital output tapped filter is provided in which the filtered output signals are latched into a first latch circuit by the clock signal which clocks the serial shift register. Output signals are thereby held in the register during the time that new data values from the shift register are propagating through the adder tree and weighting function circuits. By the time that the clock signal again clocks the shift register, the filter output signal has settled, and can again be latched into the latch circuit. The signals at the output of the latch circuit are thus immunized from signal ripple. A second latch circuit is coupled to the output of the first latch circuit, and is clocked by the same clock signal as the first latch circuit. Consecutively produced filtered data words are thereby held in the latches, and the latched signals of N bits are applied to inputs of an N bit adder. The N bit adder produces an output signal of N+1 bits. The least significant bit of the adder output signal is discarded to produce an output signal of N bits with an improved signal-to-noise ratio. Since the latch circuits are latched by the same clock signal, and their output signals are applied to the same adder, substantially no ripple appears in the N bit output signal of the adder.

4 Claims, 6 Drawing Figures

DIGITAL VIDEO SIGNAL PROCESSING FILTERS WITH SIGNAL-TO-NOISE ENHANCEMENT

The present invention relates to digital filters and, in particular, to digital filters in which filtered output signals are selectively latched during stable signal conditions and averaged to improve the signal-to-noise ratio of the filtered signals.

In a television receiver in which the baseband video signal is processed digitally, numerous digital filters are required to separate and filter the luminance and chrominance signal components. Digital filters of the finite impulse response (FIR) variety may be constructed using either input tapped shift registers or output tapped shift registers, as shown in Chapter 9 of the text "Theory and Application of Digital Signal Processing", by Rabiner and Gold (Prentice-Hall, 1975). The input tapped FIR filter described in that text is comprised of a plurality of one-clock delay latches with adders interposed following each delay latch. An input signal is applied in parallel to the first delay latch and second inputs of the adders by way of weighting function circuits, which weight the applied signals. Weighted signal samples are thus accumulated as they are added and shifted through the register of latches to produce a final output signal at the output of the last adder. Input tapped FIR filters are generally advantageous because the accumulated data words are continuously latched throughout the filter, producing filtered output data in a continuously clocked stream of words. The input tapped FIR filter is undesirable in many applications because the serial accumulation of data often requires an expansion of register size in later stages of the filter.

Output tapped FIR filters are also described in the Rabiner and Gold text. In the output tapped FIR filter, input signals are applied to a serial shift register having a plurality of output taps. Signals taken from the output taps are weighted by a plurality of weighting function circuits, and the weighted signals are then combined in parallel by an adder tree arrangement to produce a filtered output signal. Through careful application of the tapped signals to the adder tree, several output tapped signals can be weighted by a single weighting function circuit, and adder sizes can be minimized, resulting in a reduction in register sizes and necessary hardware.

It has been found, however, that optimum arrangement of the adder tree and weighting function circuits in the output tapped FIR filter often results in the creation of signal paths of different lengths from ones of the register output taps to the final adder tree output. For instance, signals from some of the output tapped signals may pass through three or four adders in the tree before reaching the filter output, thereby encountering the propagation delays of three or four adders. Other output tapped signals may pass through only two or three adders, thereby encountering fewer propagation delays on their way to the output. The difference between the propagation delays of the longest and shortest signal paths in the adder tree define what is referred to as the settling time of the filter, during which time the output signal of the filter is only partially complete and therefore undependable. When a digital FIR filter with such unequal path lengths is processing a video signal, for example, ripple will appear in the filtered output signal as the filter settles. Accordingly, it is desirable to provide an output tapped FIR filter in which such output signal ripple is prevented.

When a digital FIR filter is provided which does not use floating point arithmetic (which increases register lengths), roundoff and truncation of data words tend to create poorly resolved data words by reason of variations in the least significant bits of the processed data. In a television receiver, such variations of the least significant bits in a digital processor can create low amplitude noise in reproduced television image. Accordingly, it is desirable to provide means for improving the signal-to-noise ratio of signals processed by a digital filter.

In accordance with the principles of the present invention, a digital output tapped filter is provided in which the filtered output signals are latched into a first latch circuit by the clock signal which clocks the serial shift register. Output signals are thereby held in the register during the time that new data values from the shift register are propagating through the adder tree and weighting function circuits. By the time that the clock signal again clocks the shift register, the filter output signal has settled, and can again be latched into the latch circuit. The signals at the output of the latch circuit are thus immunized from signal ripple.

In a preferred embodiment of the present invention, digital output tapped FIR filters are used to both demodulate and filter the color mixture signals of a digital video signal. Demodulation is accomplished by appropriately clocking chrominance signal components into the filter shift register by a clock signal timed in relation to the chrominance signal. The same clock signal that is used to accomplish demodulation is used to latch the demodulated and filtered output signals into the latch circuit.

In accordance with a further aspect of the present invention, a second latch circuit is coupled to the output of the first latch circuit, and is clocked by the same clock signal as the first latch circuit. Consecutively produced filtered data words are thereby held in the latches, and the latched signals of N bits are applied to inputs of an N bit adder. The N bit adder produces an output signal of N+1 bits. The least significant bit of the adder output signal is discarded to produce an output signal of N bits with an improved signal-to-noise ratio. Since the latch circuits are latched by the same clock signal, and their output signals are applied to the same adder, substantially no ripple appears in the N bit output signal of the adder.

In the drawings:

FIG. 5 is a phasor diagram useful in explaining the operation of the color mixture signal demodulator and filter circuits of FIGS. 2, 3 and 4.

Figure 1:
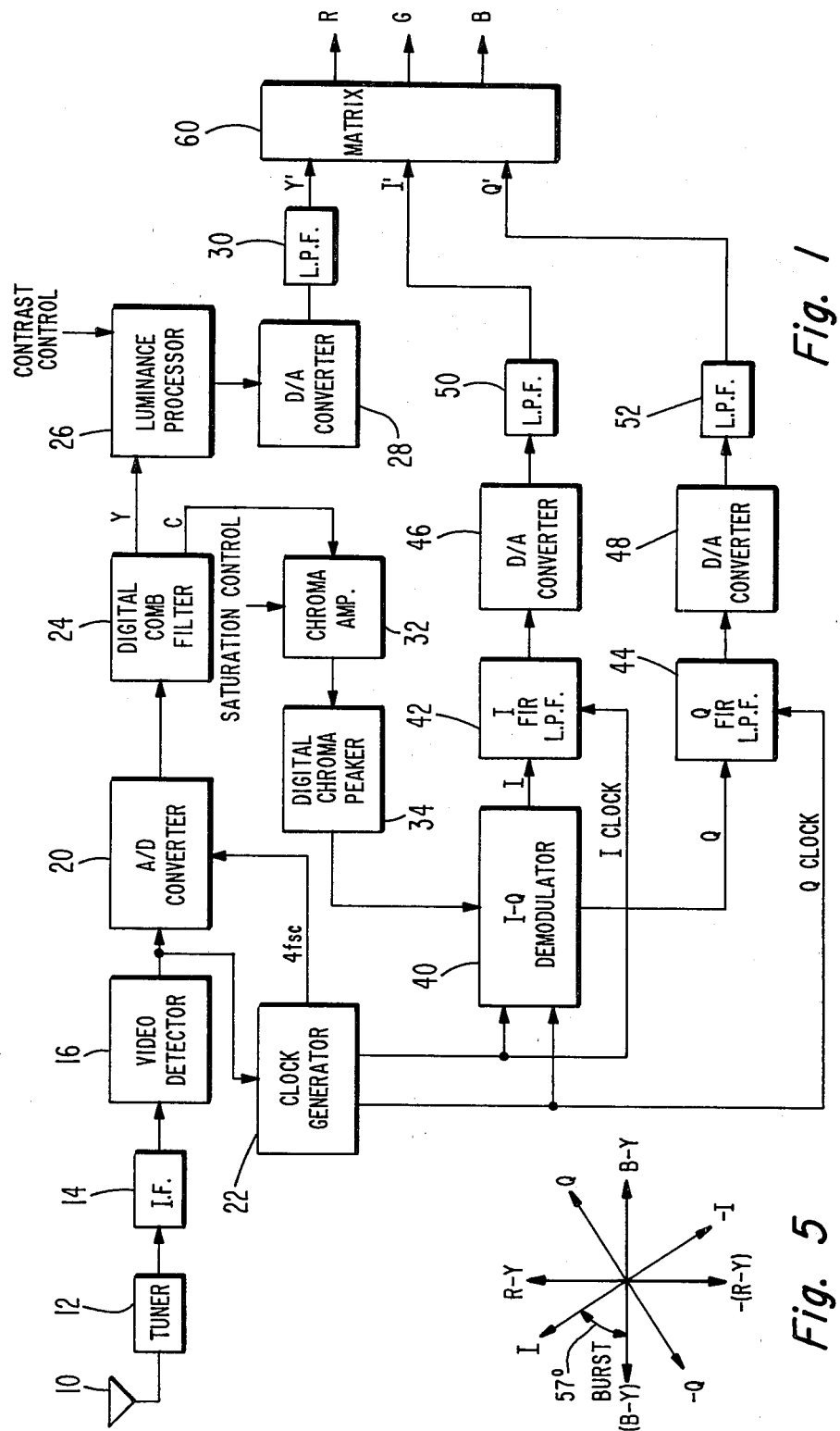
FIG. 1 illustrates, in block diagram form, a digital baseband signal processing system.

In FIG. 1, a television signal is received by an antenna 10 and successively processed by a tuner 12, intermediate frequency circuits 14, and a video detector 16, which are constructed in a conventional manner. The detected video signal at the output of the detector 16 is applied to the input of an analog-to-digital (A/D) converter 20. The A/D converter 20 samples the video signal at a rate equal to four times the color subcarrier frequency ($4f_{sc}$), and produces digital samples of the video signal at this rate. Each digital sample, or word, may comprise, for example, eight bits produced in parallel. In an eight-bit system, the analog video signal will be quantized to one of two-hundred and fifty-six discrete levels. The $4f_{sc}$ sampling clock for the A/D converter 20 is developed by a clock generator 22, which produces the signal in phase and frequency synchronism with the color burst signal of the analog video signal provided by the video detector 16.

The digitized video signal produced by the A/D converter 20 is applied to an input of a digital comb filter 24, such as that described in the article "Digital Television Image Enhancement", by John P. Rossi, 84 SMPTE at 545-51 (1974). The comb filter 24 produces separated luminance (Y) and chrominance (C) signals. The luminance signals Y are applied to a luminance signal processor 26. The luminance processor 26 is responsive to a viewer controlled contrast control signal and produces a processed luminance signal, which is applied to the inputs of a digital to analog converter 28. The luminance signal, now in analog form, is filtered by a lowpass filter 30 to remove sampling frequency components, and a processed luminance signal Y' is applied to one input of a matrix arrangement 60.

The separated chrominance signal C is applied to the input of a chroma amplifier 32. The chroma amplifier 32 amplifies the chrominance signal in response to a viewer controlled color saturation control signal, and applies the amplified chrominance signal to the input of a digital chroma peaker 34. The chroma peaker 34 is a digital filter which modifies the response characteristic exhibited by the chrominance signal at this point to compensate for the response characteristic of the intermediate frequency circuits 14. The intermediate frequency circuits generally locate the color subcarrier frequency on the lower frequency slope of the I.F. passband, causing the color sidebands to exhibit a rolloff of 6 db per octave. The chroma peaker 34 compensates for this rolloff to cause the chrominance signal to exhibit an essentially flat amplitude versus frequency response. If the I.F. circuits 14 are designed to provide an essentially flat amplitude versus frequency response for color signals, the chroma peaker 34 may be replaced by a chroma bandpass filter with a response characteristic located about the color subcarrier frequency.

The peaked or bandpassed chrominance signals are then applied to an input of an I-Q demodulator 40. The I-Q demodulator demodulates the chrominance signal into its baseband I and Q color mixture signal components. The demodulated I signal is applied to an input of an I finite impulse response (FIR) filter 42, and the demodulated Q signal is applied to an input of a Q FIR filter 44. The I filter has a passband extending from zero to approximately 1.5 MHz, and the Q filter has a passband extending from zero to 0.5 MHz. The I and Q filters remove high frequency noise contained in the color signals by reason of the broad bandwidth of the preceding processing circuitry.

The filtered I and Q signals are converted to analog signals by D/A converters 46 and 48, respectively, and the analog signals are then filtered by lowpass filters 50 and 52 to remove sampling frequency components. The resultant I' and Q' signals are applied to the matrix arrangement 60, where they are matrixed with the Y' signal to produce R, G and B output signals. The matrix arrangement may comprise, for example, a resistive signal combining matrix.

Figure 6:
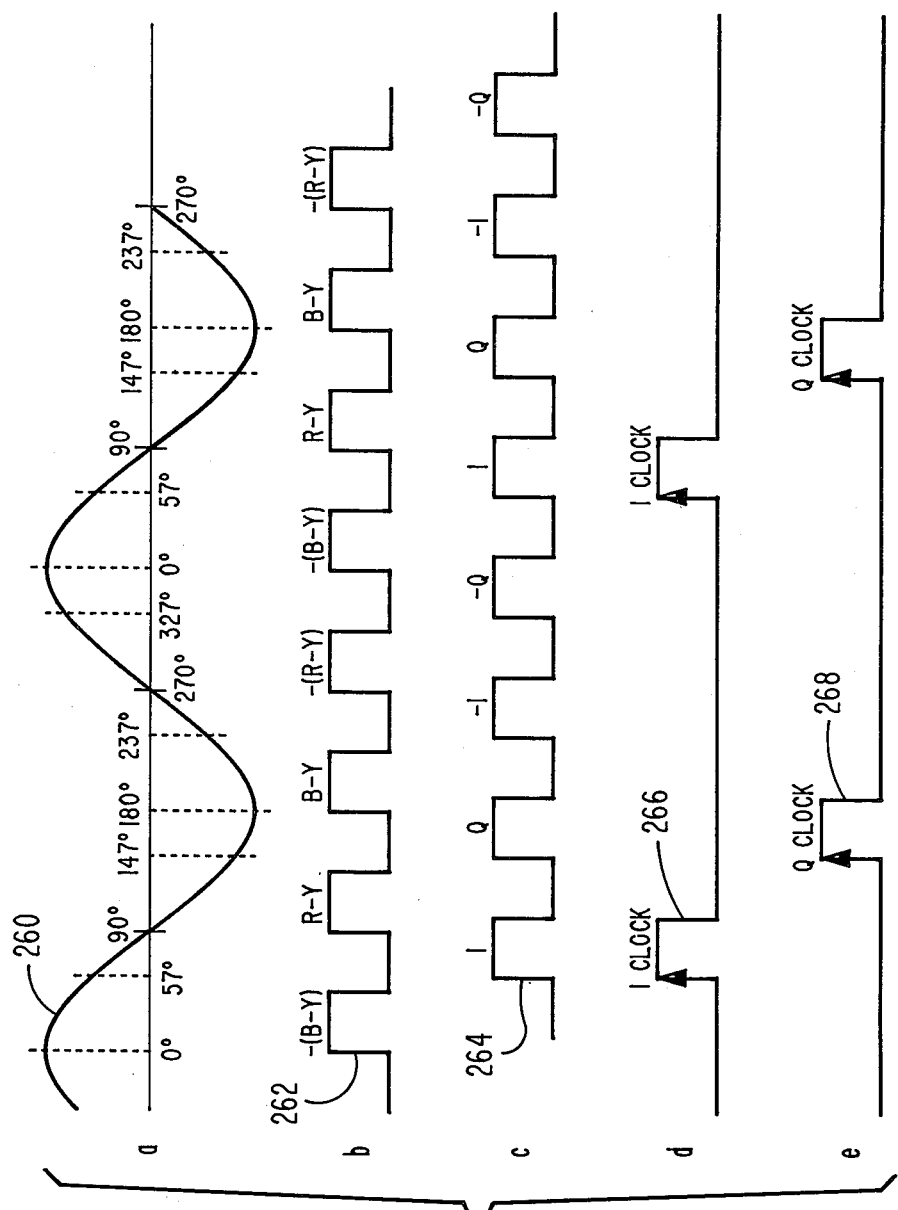
FIG. 6 illustrates waveforms useful in explaining the operation of the arrangements of FIGS. 2, 3 and 4.

The clock generator 22 of FIG. 1 produces clock signals illustratively shown in FIG. 6. A color video signal produced at the output of the video detector 16 will contain a color burst signal component of approximately a 3.58 MHz frequency. Two cycles of this color burst signal 260 are shown in FIG. 6a. The clock generator 22 contains one or more phase-locked loops which are responsive to the burst signal 260 for producing a phase-aligned $4f_{sc}$ sampling signal. If the $4f_{sc}$ sampling signal is aligned with the zero degree phase of the burst signal 260, it will appear as representatively shown by waveform 262 of FIG. 6b. The analog video signal may then be sampled along its color difference signal axes (R-Y) and (B-Y), as indicated by the phasor relationship of the color burst signal and the (R-Y) and (B-Y) color difference signals shown in FIG. 5, and readily demodulated at the illustrated angles of the burst signal 260 of 0°, 90°, 180° and 270°.

In the examples illustrated in this application, the clock generator will be assumed to produce a phase shifted version of waveforms 262, as shown by waveform 264 in FIG. 6c. Waveform 264 is also a $4f_{sc}$ sampling signal shifted 57° in phase with respect to the burst phase so as to be aligned with the I and Q color mixture signal axes shown in FIG. 5. Digital encoding and color demodulation may then be done along the I and Q axes to take advantage of the wider bandwidth of the I signal (1.5 MHz versus 0.5 MHz for the color difference signals). Ones of the pulses of the waveform 264 are gated by the clock generator 22 to the I-Q demodulator 40, the I FIR filter 42, and Q FIR filter 44 for color demodulation and filtering. Specifically, the I clock pulses are gated to the demodulator and I FIR filter 42, as shown by waveform 266 of FIG. 6d. The I clock pulses are seen to have leading edges aligned with the 57° angle of the burst signal 260, which are used to time the demodulator and I filter. The Q clock pulse of waveform 6c are gated to the demodulator and filter the Q color mixture signal, as represented by waveform 268 in FIG. 6e. The leading edges of the Q clock pulses of FIG. 6e are aligned with the 147° angle of the color burst signal to properly time the demodulator and Q filter. Clock generator circuits suitable for use as clock generator 22 are described in concurrently filed U.S. patent application Ser. No. 298,270, entitled "CLOCK GENERATOR FOR A DIGITAL COLOR TELEVISION SIGNAL RECEIVER".

Figure 2:
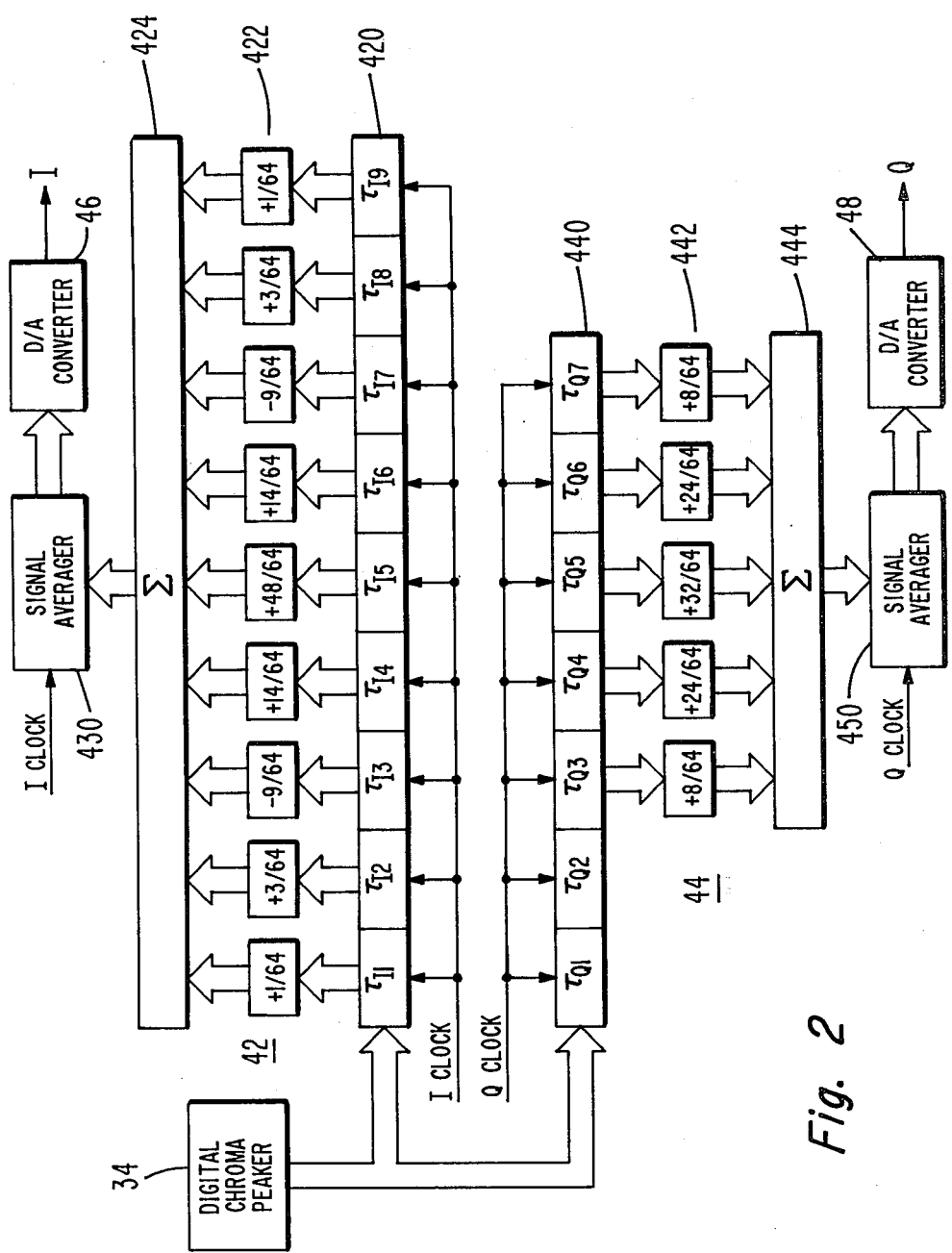
FIG. 2 illustrates, in block diagram form, color mixture signal demodulator and filter circuits constructed in accordance with the principles of the present invention.
Figure 3:
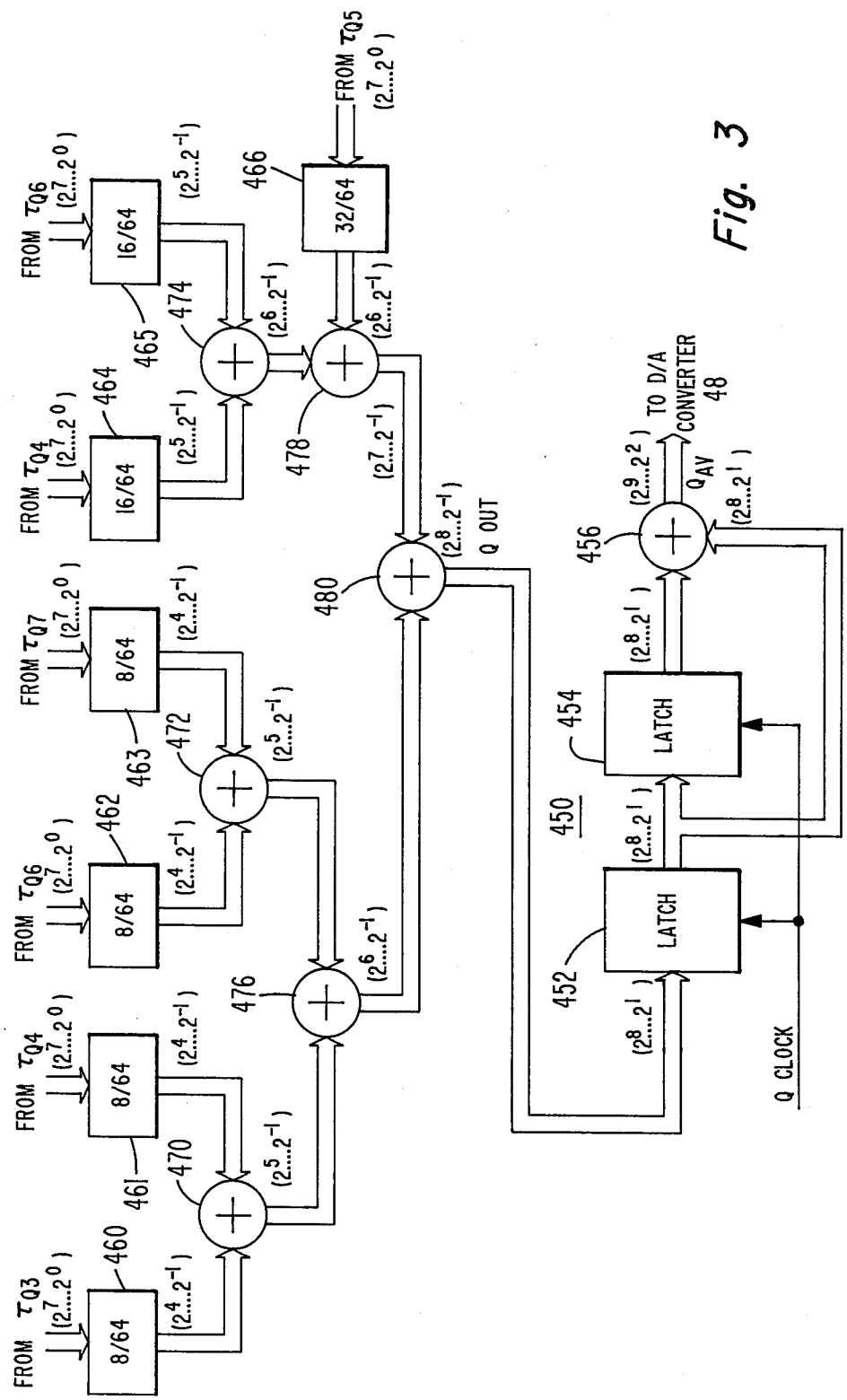
FIG. 3 illustrates, in block diagram form, a portion of a first color mixture signal FIR filter constructed in accordance with the principles of the present invention.
Figure 4:
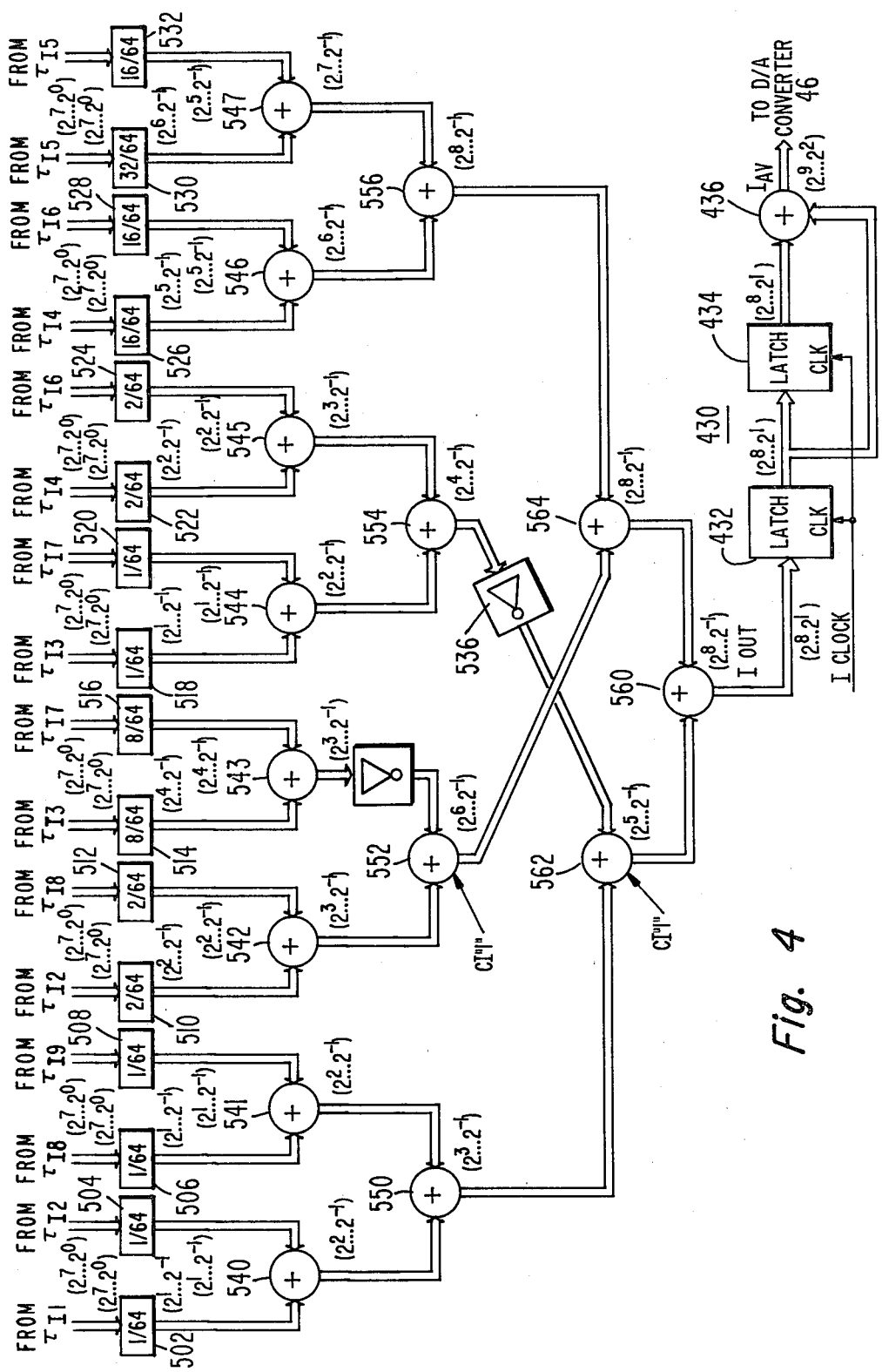
FIG. 4 illustrates in block diagram form, a portion of a second color mixture signal FIR filter constructed in accordance with the principles of the present invention.

The I-Q demodulator 40, the I FIR filter 42, and the Q FIR filter 44 of FIG. 1 are constructed in accordance with the principles of the present invention as shown in FIGS. 2, 3 and 4. The eight-bit chrominance signal produced by the digital chroma peaker 34 is applied in parallel to two shift registers 420 and 440, each stage of which stores and shifts an eight-bit word in response to a clock signal. In the remaining FIGURES, the broad stripe connections represent parallel lines of digital information. The eight bit words of the chrominance signal are clocked into the first stage $\tau_{I1}$ of the I register 420 by an I clock signal produced by the clock generator 22 of FIG. 1, which also shifts the words through the register 420 to the last stage $\tau_{I9}$. A new data word is loaded in the first stage $\tau_{I1}$ during every I clock pulse of FIG. 6c, which occur at a phase angle of 57° with respect to the color burst signal 260 of FIG. 6a. The I data words are thus clocked through the register 420 at a 3.58 MHz rate.

The shift register stages $\tau_{I1}$ through $\tau_{I9}$ are tapped to provide output signals for weighting function circuits shown at 422. Each of the weighting function circuits multiplies the tapped shift register signal by the weighting coefficient shown in the respective block in FIG. 2. The tap weighted signals are then applied to a summing network 424, which combines the tap weighted signals to produce a filtered I signal. The filtered I signal is then applied to the input of a signal averaging circuit 430, which is constructed in accordance with the principles of the present invention. The signal averaging circuit 430 improves the signal-to-noise ratio of the applied signal, and its output is coupled to the input of the D/A converter 46, which reproduces the filtered I signal in analog form.

In a similar manner, Q signal samples are clocked into and through the Q register 440 at a 3.58 MHz rate by the Q clock signal produced by the clock generator 22 of FIG. 1. Stages $\tau_{Q1}$ and $\tau_{Q2}$ of this register provide delay prior to tapped stages $\tau_{Q3}$ through $\tau_{Q7}$. Output signals from stages $\tau_{Q3}$ through $\tau_{Q7}$ are applied to weighting function circuits shown at 442, and tap weighted signals are then combined in a summing network 444. The filtered Q signal at the output of the summing network 444 is applied to a second signal averaging circuit 450 the output of which is coupled to the input of D/A converter 48 to convert the filtered Q signal to an analog signal.

The digital I and Q filters of FIG. 2 perform I and Q demodulation due to the clocking of registers 420 and 440 by the I and Q clocks, respectively, which shift I signal samples into the I register 420 and Q signal samples into the Q register 440. Since the registers are both clocked at a 3.58 MHz rate, the two filters exhibit equal group delays for proper phasing of the demodulated signals. The I FIR filter 42 attenuates frequencies above the 1.5 MHz upper frequency of the I signal passband, to eliminate high frequency noise, such as white noise, from the color mixture signal. Similarly, the Q FIR filter 44 eliminates noise above the 0.5 upper frequency of the Q signal.

In addition, the proper phase relationship of the demodulated I and Q signals is maintained by aligning the filters in accordance with their impulse response characteristics. The impulse responses of the two FIR filters are centered about their center taps: tapped stage $\tau_{I5}$ of the I filter 42 and tapped stage $\tau_{Q5}$ of the Q filter 44. In order to align these taps, stages $\tau_{Q1}$ and $\tau_{Q2}$ are coupled ahead of tapped Q filter stages $\tau_{Q3}$ through $\tau_{Q7}$. The I and Q FIR filters are described in further detail in concurrently filed U.S. patent application Ser. No. 297,556, entitled "DIGITAL COLOR TELEVISION SIGNAL DEMODULATOR".

The substantially equal group delays of the analog I and Q signals produced by D/A converters 46 and 48 are maintained by constructing lowpass filters 50 and 52 to have substantially equal response characteristics. These filters are used to eliminate clock signal frequencies from the I and Q signals, and therefore must attenuate signals of the 3.58 MHz I and Q clock signal frequency. In addition, it is desirable to attenuate the first subharmonic frequency of the clock frequency, of 1.79 MHz. Thus, filters 50 and 52 are each designed to have a 3 db point in the vicinity of 1.5 to 1.6 MHz.

The weighting function circuits 442, the summing network 444, and signal averaging circuit 450 of the Q FIR filter of FIG. 2 are shown in greater detail in FIG. 3. The weighting function circuits and summing network are configured in a shift and add adder tree arrangement. The eight bit lines from the shift register 440 are identified as $2^7 \ldots 2^0$ for each line, from most significant bit (MSB) to least significant bit (LSB). The weighting function values of circuits 442 in FIG. 2 are all seen to be multiples of inverse powers of two. Thus, the 8/64 weight, for instance, may be produced by shifting the eight bit word from the shift register to the right by three places, so that the $2^7$ bit is in the $2^4$ bit location, the $2^6$ bit is in the $2^3$ bit location, etc. Furthermore, shift registers are not needed to perform this shift. In practice, the effect of a shift is achieved in the arrangement of FIG. 3 by applying the $2^7$ bit of the output of stage $\tau_{Q3}$ to the $2^4$ bit input of an adder 470, the $2^6$ bit to the $2^3$ bit input of the adder, etc. The weighting function circuit 460 in FIG. 3 connotes this coupling, as do weighting function circuits 461, 462, and 463, which couple the outputs of stages $\tau_{Q4}$, $\tau_{Q6}$, and $\tau_{Q7}$ to the inputs of adders 470 and 472.

In a similar manner, weighting function circuits 464 and 465 divide signals from stages $\tau_{Q4}$ and $\tau_{Q6}$ by 16/64 by shifting the signals two places to the right in their coupling to the inputs of an adder 474. Weighting function circuit 466 divides the signal from stage $\tau_{Q5}$ by 32/64 by shifting the signal to the right by one place in coupling it to an adder 478.

The adders 470, 472, 474 and 478 receive weighted words scaled so that the LSB has a value of $2^{-1}$. Bits of lesser significance are not used.

It is also seen in FIG. 2 that the signals from stages $\tau_{Q4}$ and $\tau_{Q6}$ are weighted by 24/64. This weight is achieved by dividing the outputs of stages $\tau_{Q4}$ and $\tau_{Q6}$ by 8/64 and 16/64 by circuits 461, 464 and 462, 465, respectively. The addition of these two weighted signals in the adder tree produces weighted signal components of 24/64 in the final output.

In the adder tree, outputs of adders 470 and 472 are coupled to inputs of an adder 476, the output of which is coupled to an input of an adder 480. The output of adder 474 is coupled to a second input of adder 478, the output of which is coupled to a second input of adder 480. A ten bit Q signal ($2^8 \ldots 2^{-1}$) is produced at the output of adder 480.

The eight most significant bits of the output word of adder 480 are applied to inputs of an eight-bit latch circuit 452. The outputs of the latch circuit 452 are coupled to the inputs of a similar latch circuit 454 and to first inputs of an adder 456. The outputs of latch circuit 454 are coupled to second inputs of adder 456. Both latch circuits 452 and 454 are clocked by the Q clock signal used to clock the shift register 440 in FIG. 2. Adder 456 produces a nine-bit output word ($2^9 \ldots 2^1$) in response to the eight-bit input words. The eight most significant bits ($2^9 \ldots 2^2$) of the output of adder 456 are applied to the D/A converter 48 of FIG. 1.

The weighting function circuits 422, the summing network 424 and the signal averaging circuit 430 of the I FIR filter of FIG. 2 are shown in FIG. 4 in further detail. As in the arrangement of FIG. 3, the weighting functions used are all multiples of inverse powers of two, permitting the use of the shift and add technique for signal weighting. Signal weighting is again accomplished by applying selected most significant bits of the data words from the shift register 420 to the first rank of adders in an adder tree arrangement, in which the LSB has a value of $2^{-1}$.

In FIG. 4, data words from stages $\tau_{I1}$ and $\tau_{I2}$ are weighted by 1/64 by applying the three most significant bits of these words to the inputs of an adder 540, as indicated by weighting function blocks 502 and 504. Blocks 506 and 508 indicate that similar weights are applied to data words from stages $\tau_{I8}$ and $\tau_{I9}$, which are applied to inputs of an adder 541. Similarly, data words from stages $\tau_{I3}$ and $\tau_{I7}$ are weighted by 1/64 as indicated by blocks 518 and 520, and are applied to inputs of an adder 544.

Data words from stages $\tau_{I2}$ and $\tau_{I8}$ are weighted by 2/64 by applying the four most significant bits of these words to inputs of an adder 542. Data words from stages $\tau_{I4}$ and $\tau_{I6}$ are also weighted by 2/64 and applied to inputs of an adder 545.

Data words from stages $\tau_{I3}$ and $\tau_{I7}$ are weighted by 8/64 by applying the six most significant bits of words from these stages to the inputs of an adder 543. Data words from stages $\tau_{I4}$ and $\tau_{I6}$ are weighted by 16/64 by applying the seven most significant bits of words from these stages to the inputs of an adder 546. Finally, data words from stage $\tau_{I5}$ are weighted by 32/64 and 16/64 by applying the eight and seven most significant bits, respectively, to inputs of an adder 547. The adder 547 will then produce data words of stage $\tau_{I5}$ weighted by 48/64, which is the desired weight for words of this stage.

The outputs of adders 540 and 541 are coupled to inputs of an adder 550, the output of which is coupled to an input of an adder 562. The output of adder 542 is coupled to an input of an adder 552. The outputs of adders 544 and 545 are coupled to inputs of an adder 554. The outputs of adders 546 and 547 are coupled to inputs of an adder 556, the output of which is coupled to an input of an adder 564.

In FIG. 2, it is seen that data words from stages $\tau_{I3}$ and $\tau_{I7}$ are weighted by minus 9/64. The minus sign is produced by subtractively combining weighted data from these stages with the other data words in FIG. 4. Words from these two taps are weighted by 8/64 at the output of adder 543. These words are then subtractively combined with weighted data from adder 542 in adder 552. Output data of adder 543 is two's complemented for subtraction by, first, inverting all bits of the data in inverting circuit 534, then adding a "one" to the inverted data by applying a logical "1" to the carry in input of adder 552. The output of adder 552, including two terms weighted by $-(8/64)$, is coupled to a second input of adder 564.

Similarly, the output data produced by adder 554 is subtractively combined with the rest of the data in the adder tree by inverting all bits in an inverting circuit 536, then applying the inverted data together with a carry in logical "1" to a second input of adder 562. The outputs of adders 562 and 564 are coupled to inputs of an adder 560, which produces a filtered I signal. In adder 560, tap weighted values of $-(8/64)$ coupled for stages $\tau_{I3}$ and $\tau_{I7}$ by way of adder 564 are combined with weighted values of $-(1/64)$ from the same stages by way of adder 562 to produce the desired weighted value of $-(9/64)$ of the data from stages $\tau_{I3}$ and $\tau_{I7}$ in the final output. Similarly, the final adder 560 combines weighted value of $-(2/64)$ from stages $\tau_{I4}$ and $\tau_{I6}$ with weighted values of (16/64) from these stages to produce the desired term of (14/64) of data from stages $\tau_{I4}$ and $\tau_{I6}$ in the final output.

The eight bit most significant bits of the output of adder 560 are applied to the inputs of an eight-bit latch circuit 432. The outputs of latch circuit 432 are coupled to the inputs of a similar latch circuit 434, and to first inputs of an adder 436. The outputs of the second latch circuit 434 are coupled to second inputs of the adder 436. Both latch circuits 432 and 434 are clocked by the same I clock signal used to clock the I shift register 420 in FIG. 2. Adder 436 produces nine-bit output words in response to the eight-bit input words. The eight most significant bits of these output words are applied to the D/A converter 46 in FIG. 2.

It has been found that a certain amount of time is required for the I and Q FIR filters to settle between the moment that the I and Q clocks shift new data arrays into the tapped stages of shift registers 420 and 440, and the moment that stable output signals are produced at the outputs of adders 480 and 560. This settling time is a function of the number of levels, or ranks, of adders in the trees, the propagation delay times of the adders, and the interposition of other circuit elements. For instance, in the Q FIR filter of FIGS. 2 and 3, data words from the tap of stage $\tau_{Q5}$ pass through only two adders (478 and 480) on their path to the output of adder 480, whereas all other tapped signals must pass through three adders. In the I FIR filter of FIG. 4, all tapped signals pass through four adders on their paths to the output of adder 560, but those signals passing through adders 543 and 554 encounter additional propagation delays by their passage through inverting circuits 534 and 536. During the time required for the tapped signals to pass to the outputs, the filter output signals are unreliable and can produce ripple in the output signals as the filters settle.

To prevent the settling time ripple from adversely affecting the filtered I and Q signals, signal averaging circuits 430 and 450 are employed at the outputs of the final adders of the FIR filters. The signal averaging circuits operate to latch the filtered output signals during periods of stable signal conditions, and to sum consecutive signals to provide a three dB improvement in the signal-to-noise ratios of the filtered I and Q signals. The operation of the signal averaging circuits is essentially the same except for the clock signals, and may be understood by analyzing the operation of the Q signal averaging circuit 450.

In operation, transitions of the Q clock signal 268 of FIG. 6 that shift the Q data words through the shift register 440 of FIG. 2 also latch the filtered Q signal from adder 480 into the latch circuit 452. The new data in the shift register now begins to pass through the adder tree to the output of adder 480, but the output of adder 480 is now isolated because the latch circuit 452 has stored the previous filtered Q signal value. As the filtered Q signal is latched into latch circuit 452, the filtered Q signal previously stored in latch 452 is simultaneously latched into latch 454 by the Q clock signal. The latch circuits now contain consecutive filtered Q signal values, which are applied to adder 456. The latch circuits apply eight-bit words ($2^8 \ldots 2^1$) to adder 456, which adds the two words to produce a nine-bit sum word. Only the eight most significant bits of the sum word ($2^9 \ldots 2^2$) are passed on to the D/A converter 48, effectively averaging the latch Q signal words. A three dB signal-to-noise improvement is provided by this signal averaging.

By use of the signal averaging circuits 430 and 450, the I and Q filter adder trees have almost a full cycle of the 3.58 MHz clock signals to settle before their outputs are again sampled and latched into latches 432 and 452. This substantial settling time period permits the use of relatively slow logic in the adder tree. Moreover, it is seen that only a single clocking signal, the I clock signal or the Q clock signal, is needed to clock both the shift register and the signal averaging circuit of each FIR filter.

What is claimed is:

1. In a television receiver, including a source of digital video signals, a digital filter for processing said digital video signals comprising:

means for producing a clock signal in a timed relationship with said digital video signals;

a serial shift register including a plurality of clocked shift register stages and having a first shift register stage coupled to receive said digital video signals and a plurality of output taps emanating from ones of the stages of said register;

a plurality of weighting function circuits coupled to ones of said output taps for weighting signals applied thereto;

an adder tree arrangement, including a plurality of adders, and having inputs coupled to ones of said weighting function circuits and an output at which a filtered digital signal is produced;

a latch circuit having a signal input coupled to the output of said adder tree arrangement, an output, and a clock signal input;

a second latch circuit having a signal input coupled to the signal output of said first-named latch circuit, a signal output, and a clock signal input;

an adder having a first input coupled to the output of said first-named latch circuit, a second input coupled to the output of said second latch circuit, and an output at which averaged digital video signal samples are produced; and means for applying said clock signal to said clocked shift register stages and said clock signal inputs of said latch circuit and said second latch circuit.

2. In a television receiver, including a source of analog video signals including a color burst signal component; means, coupled to said source of analog video signals, for converting said analog video signals to digital video signals; and means, coupled to said converting means, for generating digital chrominance signal components; apparatus for producing a demodulated and filtered color mixture signal comprising:

a clock generator circuit, responsive to said color burst signal component, for producing a clock signal in a substantially constant phase relationship with said color burst signal component;

a digital demodulator and filter including:

a shift register having an input coupled to receive said digital chrominance signal components, a plurality of output taps, and responsive to said clock signal for shifting selected ones of said digital chrominance signal components corresponding to a given color mixture signal through said shift register;

a plurality of weighting function circuits coupled to ones of said output taps for weighting color mixture signal samples applied thereto;

an adder tree arrangement, including a plurality of adders having inputs coupled to ones of said weighting function circuits and a final adder stage having an output at which a filtered color mixture signal comprising a sum of weighted color mixture signal samples is produced;

first and second latch circuits serially coupled to the output of said final adder stage, said latch circuits being clocked by said clock signal; and an averaging adder having first and second input connections coupled to output connections of said first and second latch circuits, said averaging adder producing successive averaged, filtered samples of the color mixture signal.

3. In a television receiver, including a source of sampled data digital video signals, the combination comprising:

means for producing a clock signal in a timed relationship with said sampled data digital video signals;

an FIR filter having an input coupled for receiving said sampled data digital video signal, including delay stages responsive to said clock signal, and summing and weighting circuits, said FIR filter producing at an output terminal thereof, filtered replicas of said digital video samples;

first and second latch circuits serially connected to the output terminal of the FIR filter, said latch circuits being operatively controlled by said clock signal; and an adder circuit having first and second input connections coupled to output terminals of said first and second latch circuits and having an output terminal at which averaged filtered video signal samples are produced.

4. The television receiver set forth in claim 1 wherein the digital video signals include a modulated chrominance component and the clock signal-sampled data digital video signal timed relationship is arranged such that digital video signal samples clocked into the FIR filter delay stages represent a demodulated chrominance component of the video signal.

* * * * *